United States Patent [19]

Horton

[11] Patent Number: 4,720,771

[45] Date of Patent: Jan. 19, 1988

[54] HEAT SINK ASSEMBLY FOR A CIRCUIT BOARD MOUNTED INTEGRATED CIRCUIT

[75] Inventor: Thomas C. Horton, Madison, Ala.

[73] Assignee: Chrysler Motors Corporation, Highland Park, Mich.

[21] Appl. No.: 20,797

[22] Filed: Mar. 2, 1987

Related U.S. Application Data

[63] Continuation of Ser. No. 751,813, Jul. 5, 1985, abandoned.

[51] Int. Cl.$^4$ .............................................. H05K 7/20
[52] U.S. Cl. ................................... 361/388; 361/400;
174/16 HS; 165/185; 357/81
[58] Field of Search ............... 174/16 HS; 357/79, 81;
165/80.3, 185; 361/383, 386–388, 400, 405

[56] References Cited

U.S. PATENT DOCUMENTS

| | | | |
|---|---|---|---|
| 3,213,324 | 10/1965 | McAdam | 317/100 |
| 3,519,889 | 7/1970 | Monaco | 317/100 |
| 3,548,927 | 12/1970 | Spurling | 165/80 |
| 3,641,474 | 2/1972 | Owens | 339/17 L |
| 3,694,703 | 9/1972 | Wilens et al. | 317/234 R |
| 3,786,317 | 1/1974 | Thierfelder | 317/234 R |
| 3,801,874 | 4/1974 | Stefani | 317/100 |
| 3,893,161 | 7/1975 | Pesak, Jr. | 357/81 |
| 4,054,901 | 10/1977 | Edwards et al. | 357/81 |
| 4,095,253 | 6/1978 | Yoshimura et al. | 357/81 |
| 4,100,566 | 7/1978 | Okikawa et al. | 357/70 |
| 4,215,361 | 7/1980 | McCarthy | 357/81 |
| 4,259,685 | 3/1981 | Romano | 357/81 |
| 4,288,839 | 9/1981 | Prager et al. | 361/386 |
| 4,388,967 | 6/1983 | Breese | 361/386 |

Primary Examiner—G. P. Tolin
Attorney, Agent, or Firm—Mark P. Calcaterra

[57] ABSTRACT

An assembly including a lower heat sink and an upper heat sink which allows for affixation of a semiconductor to a circuit board with automatic soldering equipment and also provides the lower heat sink and upper heat sink sandwiching the semiconductor therebetween for firm, cushioned connection during assembly and for dissipating heat during semiconductor operation.

1 Claim, 6 Drawing Figures

HEAT SINK ASSEMBLY FOR A CIRCUIT BOARD MOUNTED INTEGRATED CIRCUIT

This is a continuation of U.S. Ser. No. 06/751,813 filed on July 5, 1985, now abandoned.

BACKGROUND AND SUMMARY OF THE INVENTION

This invention relates to the problems associated with mounting an integrated circuit or transfer onto a printed circuit board in such a way as to adequately secure the integrated circuit to the board, make an adequate electrical connection to the contacts on the circuit board and make sufficient contact with a heat sink device for heat dissipation purposes.

Devices for securing similar circuitry to circuit boards are described in some of the following U.S. Patents.

In U.S. Pat. No. 4,259,685 to Romano; "Clamp for Securing an Encased Power Frame to a Heat Sink", a heat sink clamp is disclosed for maintaining an integrated circuit flat against the base to which the circuit is mounted.

In U.S. Pat. No. 4,054,901 to Edwards et al.; "Index Mounting Unitary Heat Sink Apparatus with Apertured Base", a unitary heat sink is disclosed for maintaining the integrated circuit body flat against the heat sink base.

In U.S. Pat. No. 4,288,839 to Prager et al.; "Solid State Device Mounting and Heat Dissipating Assembly", a retaining device is disclosed upon which a solid state device is positioned. Incorporated in this securing means is heat dissipating means. This is more distinctly shown in FIG. 3.

In U.S. Pat. No. 3,519,889 to Monaco; "Assembly with Transistor Heat Dissipation", a clip is disclosed to mount the transistor to a body which is composed of heat sink material.

In U.S. Pat. No. 3,548,927 to Spurling; "Heat Dissipating Retainer for Electronic Component", a resilient clip is disclosed which is designed to be attached to a heat sink member.

In U.S. Pat. No. 3,893,161 to Pesak; "Frictionally Engageable Heat Sink for Solid State Devices", a heat sink for solid state devices is disclosed to frictionally engage the solid state device.

In U.S. Pat. No. 3,641,474 to Owens; "Semiconductor Mounting Structure", a capsule is disclosed for mounting a semiconductor device in such a fashion to allow the leads of the semiconductor device to be inserted into a connector socket and the semiconductor device along with the capsule to be affixed to a heat dissipating metal plate attached to a circuit board.

In U.S. Pat. No. 3,801,874 to Stefani; "Isolation Mounting for Semiconductor Device", an isolation mounting is disclosed for semiconductor device to fasten the semiconductor against an insulator and thereafter a heat sink plate.

In U.S. Pat. No. 4,215,361 to McCarthy; "Winged Self-Fastened Heat Sinks for Semiconductor Devices", a one-piece sheet metal heat sink is disclosed with internal fingers to engage and hold the semiconductor device.

In U.S. Pat. No. 3,694,703 to Wilens et al.; "Heat Dissipator for Encased Semiconductor Device Having Heat Tab Extending Therefrom", a heat dissipator is disclosed to encase a semiconductor device, the dissipator being made of a stamped sheet metal body with a slot to engage the heat conductive tab on the semiconductor device.

In U.S. Pat. No. 3,786,317 to Thierfelder; "Microelectronic Circuit Package", a mounting mechanism to isolate the semiconductor device from applied stress is disclosed.

In U.S. Pat. No. 3,213,324 to McAdam; "Variable Cooler Unit", shows one of many available heat sinks.

In U.S. Pat. No. 4,100,566 to Okikawa; "Resin-Sealed Type Semiconductor Devices and Manufacturing Method of the Same", a resin-sealed semiconductor device is disclosed which has a heat dissipating plate mounted on a mounting plate with means to prevent occurrence of cracks in the resin portion.

In U.S. Pat. No. 4,095,253 to Yoshimura; "Single In-Line High Power ResinPackaged Semiconductor Device Having an Improved Heat Dissipator", illustrates another type of heat dissipation fin-type device.

The subject heat sink was modified to its present configuration to increase disspation of the heat generated by the semiconductor device and to ease assembly.

When semiconductor devices requiring heat sinks are assembled, labor intensive hand operations are required. In addition, since semiconductor devices requiring heat sinks obviously generate large amounts of heat, testing, in addition to the normal production operational checks, must be done to assure that the heat sinks and semiconductor devices are properly mounted onto the circuit boards. The use of extreme testing conditions requires that the heat dissipation be adequate enough not only to handle the normal running conditions of the circuit, but also to handle the greater than normal heat conditions encountered during testing. In addition, labor intensive devices not only slow down the assembly process of the entire circuit board, but increase the cost of manufacturing and increase the likelihood that the circuit board and/or semiconductor device will be mishandled or dropped, thereby weakening the connections mechanically or electrically.

Therefore, it is an object of the subject invention to provide a heat dissipation means for a circuit board mounted semiconductor device which provides adequate dissipation for heat generated by the device during circuit operating conditions and testing conditions.

It is a further object of the subject invention to provide a heat sink for a semiconductor device which will minimize manual assembly onto the circuit board during the manufacturing process.

It is still a further object of the present invention to provide a heat sink for a semiconductor device with an efficient heat transfer between the semiconductor device and the surfaces of the heat sink and the circuit board.

It is still a further object of the present invention to provide a heat sink which will allow for the firm affixation of the semiconductor device and the heat sink to the circuit board without disturbing the die bond of the semiconductor device.

DESCRIPTION OF THE DRAWINGS

Other objects, features and advantages of the present invention will become more fully apparent from the following detailed description of the preferred embodiment, the appended claims and in the accompanying drawings in which:

DETAILED DESCRIPTION OF THE PREFERRED EMBODIMENT

Figure 1:
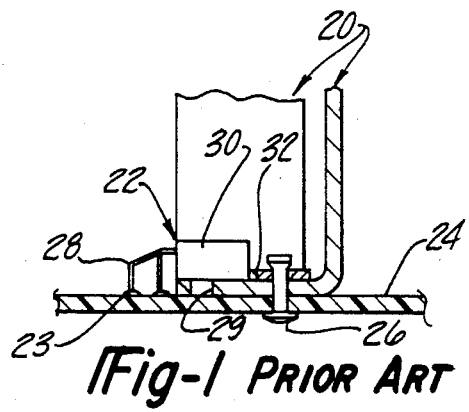
FIG. 1 illustrates an apparatus and method of attachment of a heat sink to a circuit board and to a semiconductor device, utilizing conventional methods.

Referring to FIG. 1, a unitary heat sink 20 is shown attached to a semiconductor device 22 and to a circuit board 24 by means of a conventional rivet 26.

The semiconductor device 22 comprises electrical leads 28, a resin-sealed body 30 which encapsulates the electronic integrated circuit or transistor, and conductive tab 32.

The lower flange member 19 has an anti-rotation hole 29. The hole 29 accepts a locating pin on the assembly tooling (not shown) which engages the antirotation hole when a rivet 26 or screw 27 (with nut 25) is inserted and affixed, sandwiching the conductive tab 32 to the heat sink 20 in FIG. 1, 19 and 21 in FIGS. 2-7. The engagement of the locating pin with the hole 29 and communication with semiconductor device 22 exists during the process of securing the rivet 26 or screw 27 (with nut 25) thereby preventing rotation of the heat sink members 19 and 21 and seimconductor device 22.

Not only is the above operation labor intensive, but it also could create some potential for disturbing the die bond of the conductive tab 32 to the electronic device encapsulated in the resin-sealed body 30. This possibility might occur in the following way. When the rivet 26 is inserted and affixed, sandwiching the conductive tab 32 and the heat sink 20 to the circuit board 24, the conductive tab 32 would take on the shape of the heat sink 20. In other words, if the heat sink 20 were not flat or if it were of such material as to allow warpage, the conductive tab 32 might warp, possibly disturbing the die bond of the semiconductor device 22 encapsulated by the resin-sealed body 30. This would increase the possibility of an intermittent connection.

To eliminate this possibility, the heat sink 20 was made in two pieces 19 and 21. This is shown in FIG. 2.

Upper heat sink member 21 has two flanges, upper flange 34 and lower flange 36. The purpose of the upper flange 34 is to make contact with the resin-sealed body 30 of the semiconductor device 22, thereby sandwiching the resin-sealed body 30 between the flange 34 and the lower heat sink member 19.

The purpose of the lower flange 36 is to provide communication between upper member 21 and conductive tab 32, sandwiching the conductive tab 32 between flange 36 and lower heat sink member 19. The secondary purpose of lower flange 36 is to provide a cushion between the rivet 26 or screw 27 and the conductive tab 32. This cushion effect will help prevent warpage of the conductive tab 32.

Figure 2:
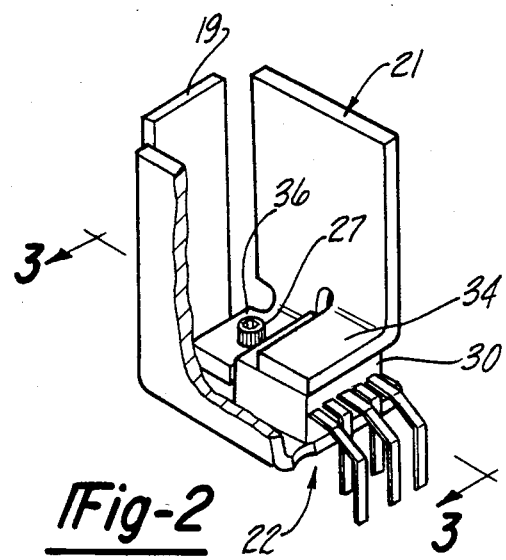
FIG. 2 is an isometric cut-away view of the heat sink assembly and semiconductor device of the subject invention showing the parts in an assembled condition.
Figure 3:
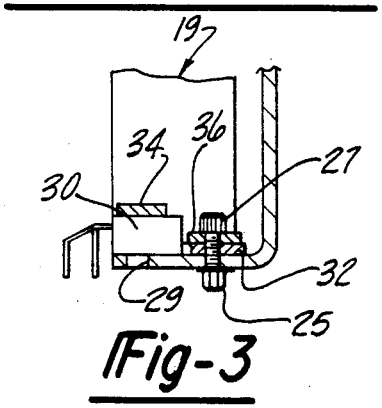
FIG. 3 is a sectional view of the assembly illustrated in FIG. 2.
Figure 4:
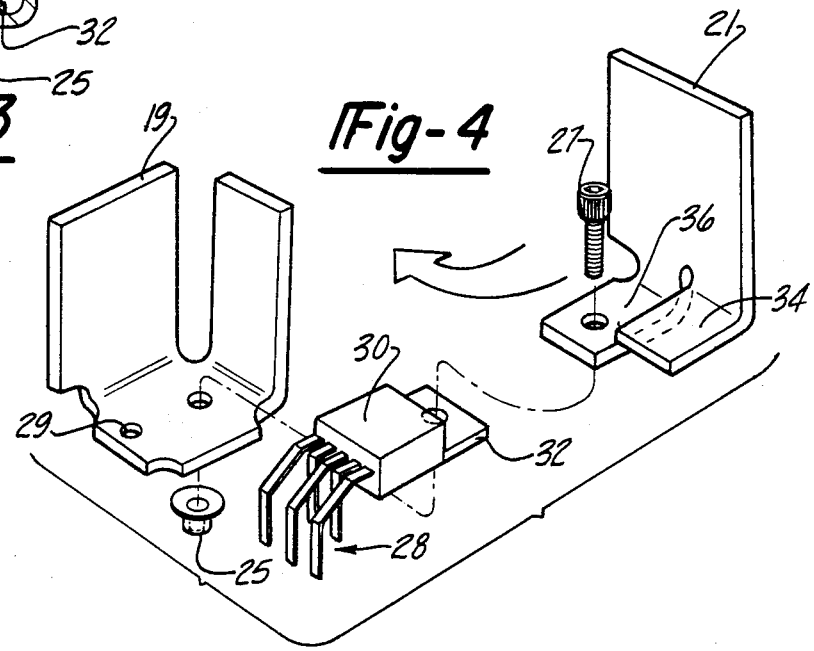
FIG. 4 is an isometric exploded view illustrating all of the parts involved in the subject invention including the connection means to the circuit board.

The assembly of FIG. 2 is shown in a sectional view in FIG. 3 showing the sandwiching effects of upper flange 34 and lower flange 36 onto resin-sealed body 30 and conductive tab 32. Also shown in FIG. 3 is the connection between the heat sink members 19 and 21 via flange 36 and screw 27 and nut 25. Note that nut 25, along with screw 27 is another embodiment of rivet 26. However, the use of nut 25 has another advantage which will be explained below.

Referring again to FIG. 1, rivet 26 affixes the heat sink and semiconductor device to circuit board 24. Previous attempts to rivet the semiconductor device 22 to the heat sink 20 separately and then hand insert the entire semiconductor device-heat sink assembly into the circuit board, creates the possibility that the only mechanical connection to circuit board 24 is via electrical leads 28 soldered to contacts 23 on circuit board 24. Due to the large amount of handling in the assembly process, the possibility to break the entire semiconductor device-heat sink assembly away from the circuit board 24 was increased. Therefore, the rivet 26 had to be inserted during the circuit board assembly process through board 26. This further increased the already labor intensive assembly process.

To circumvent this situation, a nut 25, in combination with a screw 27, was employed. The nut 25 is shown more graphically in FIG. 4. Here, in the exploded view, the parts are shown in their pre-assembly condition illustrating how they go together. Appreciate that this assembly can be made off-line, and inserted with other components into the circuit board 24's.

Figure 5:
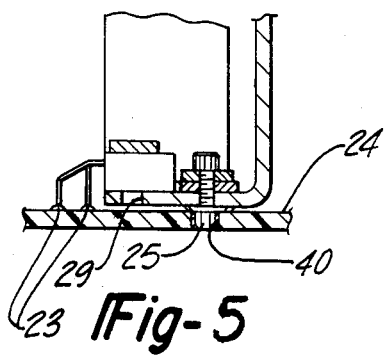
FIG. 5 is the sectional view of the assembly from FIG. 3 shown affixed and soldered to the circuit board.

Referring now to FIG. 5, the value of nut 25 can now be further appreciated. The nut 25 communicates with circuit board 24 via plated through slot 40. Nut 25 is of such material composition so as to accept solder in the automatic soldering process already employed to solder other components including semiconductor device 22 via leads 28 to circuit board 24. Now, the semiconductor device-heat sink assembly, assembled off line, is hand inserted into circuit board 24 and wave soldered along with the rest of the hand inserted and machine inserted electronic components. The electrical connections formed with solder at contacts 23 and between nut 25 and plated through slot 40 are sufficient to hold the entire semiconductor device-heat sink assembly in place, as well as make the electrical connection required.

Figure 6:
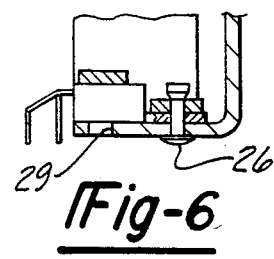
FIG. 6 is an alternative embodiment showing the heat sink assembly of the subject invention attached with conventional methods.

Referring now to FIG. 6, alternative embodiment showing the lower heat sink member 21 in sectional views. This figure illustrates the use of a conventional rivet 26. This embodiment is acceptable assuming that the rivet material will accept solder as the nut material 25 does. The heat sink may also be used with the attachment means shown in FIG. 1.

While the present invention has been disclosed in connection with the preferred embodiment thereof, it should be understood that there may be other embodiments which fall within the spirit and scope of the invention and that the invention is susceptible to modification, variation and change without departing from the proper scope or fair meaning of the following claims.

I claim:

1. An assembly, including a lower heat sink member and an upper heat sink member, each being separate, for dissipating heat generated by the operation of a semiconductor device having a die bond, electrical leads, a body and a conductive tab having a hole, the semiconductor device being located between the upper and lower heat sink members, the assembly including a circuit board mounting the semiconductor device and comprising:

- a lower heat sink member with a hole adjacent the conductive tab and contacting the bottom of the body and the conductive tab and communicating with the environment surrounding the device and sinking heat from the conductive tab;
- an upper heat sink member sinking heat from the conductive tab and from the body and having an upper flange member holding the body in continuous and tight communication with the lower heat sink member by sandwiching the body therebetween and a lower flange member with a hole adjacent and contacting the conductive tab of the semiconductor to hold the conductive tab in continuous and tight communication with the lower heat sink member by sandwiching the conductive tab therebetween so as not to disturb the die bond within the semiconductor device and to prevent warpage of the conductive tab;
- a fastening means fit through the hole in the lower flange member, the hole in the conductive tab and the hole in the lower heat sink member;
- the fastening means configured such that the lower flange, conductive tab and lower heat sink member are securely mounted together and such that a cushion is provided to prevent warpage of the conductive tab;
- the fastening means further comprising a material which will accept solder from automatic soldering equipment.

* * * * *